United States Patent
Lee et al.

(10) Patent No.: US 6,951,795 B2
(45) Date of Patent: Oct. 4, 2005

(54) METHOD FOR FABRICATING CAPACITOR USING METASTABLE-POLYSILICON PROCESS

(75) Inventors: Min-Yong Lee, Ichon-shi (KR); Hoon-Jung Oh, Ichon-shi (KR); Jong-Min Lee, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/744,048

(22) Filed: Dec. 24, 2003

(65) Prior Publication Data

US 2004/0266103 A1 Dec. 30, 2004

(30) Foreign Application Priority Data

Jun. 30, 2003 (KR) ................................. 10-2003-0043283

(51) Int. Cl.[7] ................................................ H01L 21/20
(52) U.S. Cl. ...................... 438/389; 438/386; 438/488
(58) Field of Search ................................ 438/488, 514, 438/524, 386, 389

(56) References Cited

U.S. PATENT DOCUMENTS

| 6,309,975 B1 | 10/2001 | Wu et al. |
| 6,319,788 B1 | 11/2001 | Gruening et al. |
| 6,599,840 B2 | 7/2003 | Wu et al. |
| 6,828,191 B1 * | 12/2004 | Wurster et al. ............. 438/247 |
| 2001/0012660 A1 * | 8/2001 | Parekh et al. ............... 438/253 |

FOREIGN PATENT DOCUMENTS

| JP | 2001-267527 | 9/2001 |
| JP | 2002-368133 | 12/2002 |

* cited by examiner

*Primary Examiner*—Brad Smith
(74) *Attorney, Agent, or Firm*—Mayer, Brown, Rowe & Maw LLP

(57) ABSTRACT

The present invention relates to a method for fabricating a capacitor of a semiconductor device. The method includes the steps of: forming a storage node oxide layer having a hole for forming a storage node on a substrate; forming a silicon layer on the storage node oxide layer having the hole; forming a photoresist on the silicon layer such that the photoresist fills the hole; forming a storage node having a cylinder shape inside of the hole by removing the silicon layer disposed on an upper surface of the storage node oxide layer; ion-implanting an impurity onto head portions of the storage node under a state that the photoresist remains; removing the photoresist; and growing metastable-polysilicon (MPS) grains on inner walls of the storage node.

9 Claims, 10 Drawing Sheets

METHOD FOR FABRICATING CAPACITOR USING METASTABLE-POLYSILICON PROCESS

FIELD OF THE INVENTION

The present invention relates to a method for fabricating a semiconductor device; and, more particularly, to a method for fabricating a capacitor of a semiconductor device.

DESCRIPTION OF RELATED ARTS

Current trends of large scale of integration and decrease in a minimum linewidth of a semiconductor device have led to a gradual reduction of a capacitor area. Despite of the decreased capacitor area, the capacitor formed in a cell region is mandated to have a capacitance greater than about 25 fF, which is the minimum capacitance required by each cell.

Thus, three different methods for forming such capacitor having high capacitance within the limited cell area are suggested. The first method is to use a material having a higher dielectric coefficient ($\epsilon$) such as tantalum oxide ($Ta_2O_5$), aluminum oxide ($Al_2O_3$) and hafnium oxide ($HfO_2$) instead of using such a material as silicon oxide and nitride. Herein, dielectric coefficients of silicon oxide and nitride are about 3.8 and about 7, respectively. The second method is to obtain a three dimensional capacitor structure by forming a storage node in a cylinder or concave type. The last method is to increase an effective surface area of the storage node by about 1.7 to about 2 by growing metastable-polysilicon (MPS) on a surface of the storage node.

Among the suggested methods, the last method of increasing the effective surface area of the storage node by growing MPS on the surface of the storage node has become a current focus. For fabrication of a capacitor with a MPS structure, a storage node including an amorphous silicon layer is first formed. Then, silane ($SiH_4$)-based gas is applied thereto as a seed gas, and silicon atoms migrate towards the seed layer, i.e., the amorphous silicon layer, in a vacuum state to thereby form a MPS layer. At this time, a migration speed and a quantity of the silicon atoms vary depending on a flow quantity and a period of applying the seed gas, a migration period of the silicon atoms, a temperature, a pressure and a doping concentration of an impurity, and the variations in the migration speed and quantity of the silicon atoms further make the size and quantity of the MPS layer variable.

FIG. 1 is a cross-sectional view showing a conventional capacitor.

As shown, an inter-layer insulation layer 12 is formed on a substrate 11 and is then etched to form a plurality of plugs 14 each buried into a contact hole 13 and connected to the substrate 11.

An etch barrier layer 15 and a storage node oxide layer 16 are sequentially formed on the inter-layer insulation layer 12 and are etched to form holes 17 opening each contact plug 14. Then, a storage node 18 is formed along a profile containing the hole 17. At this time, the storage node 18 has a cylinder shape. Herein, MPS grains 19 are grown on each surface of inner walls of each storage node 18.

An outer wall of each storage node 18 of the above capacitor with the MPS structure is either an amorphous silicon layer doped with a high concentration of an impurity or a crystallized polysilicon layer in order to secure a distance between the storage nodes 18. As a result, it is possible to prevent bridge formation between the neighboring storage nodes 18. That is, the use of this layer prevents bridge formation between the storage nodes 18 occurring as MPS grains are grown at the outer walls of each storage node 18.

However, the distance between the storage nodes become narrower due to large scale of integration, and thus, even small MPS grains formed at head portions of the storage node may be induced to form bridges between the storage nodes.

SUMMARY OF THE INVENTION

It is, therefore, an object of the present invention to provide a method for fabricating a capacitor capable of preventing bridge formation between neighboring storage nodes caused by MPS grains to thereby increase a surface area of the storage node.

In accordance with an aspect of the present invention, there is provided a method for fabricating a capacitor, including the steps of: forming a storage node oxide layer having a hole for forming a storage node on a substrate; forming a silicon layer on the storage node oxide layer having the hole; forming a photoresist on the silicon layer such that the photoresist fills the hole; forming a storage node having a cylinder shape inside of the hole by removing the silicon layer disposed on an upper surface of the storage node oxide layer; ion-implanting an impurity onto head portions of the storage node under a state that the photoresist remains; removing the photoresist; and growing metastable-polysilicon (MPS) grains on inner walls of the storage node.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

With reference to the accompanying drawings, detailed descriptions on preferred embodiments of a method for fabricating a capacitor will be provide hereinafter.

FIGS. 2A to 2D are cross-sectional views illustrating a method for fabricating a capacitor in accordance with a first preferred embodiment of the present invention.

Figure 1:
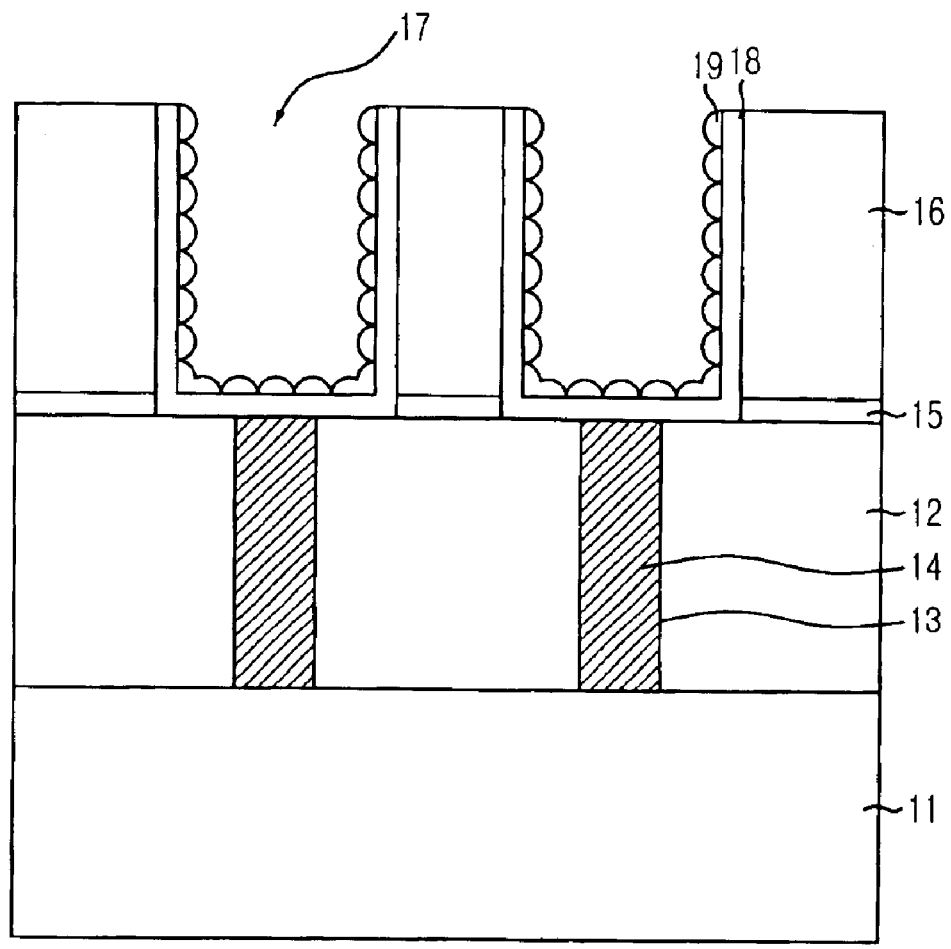
FIG. 1 is a cross-sectional view of a conventional capacitor.
Figure 2A:
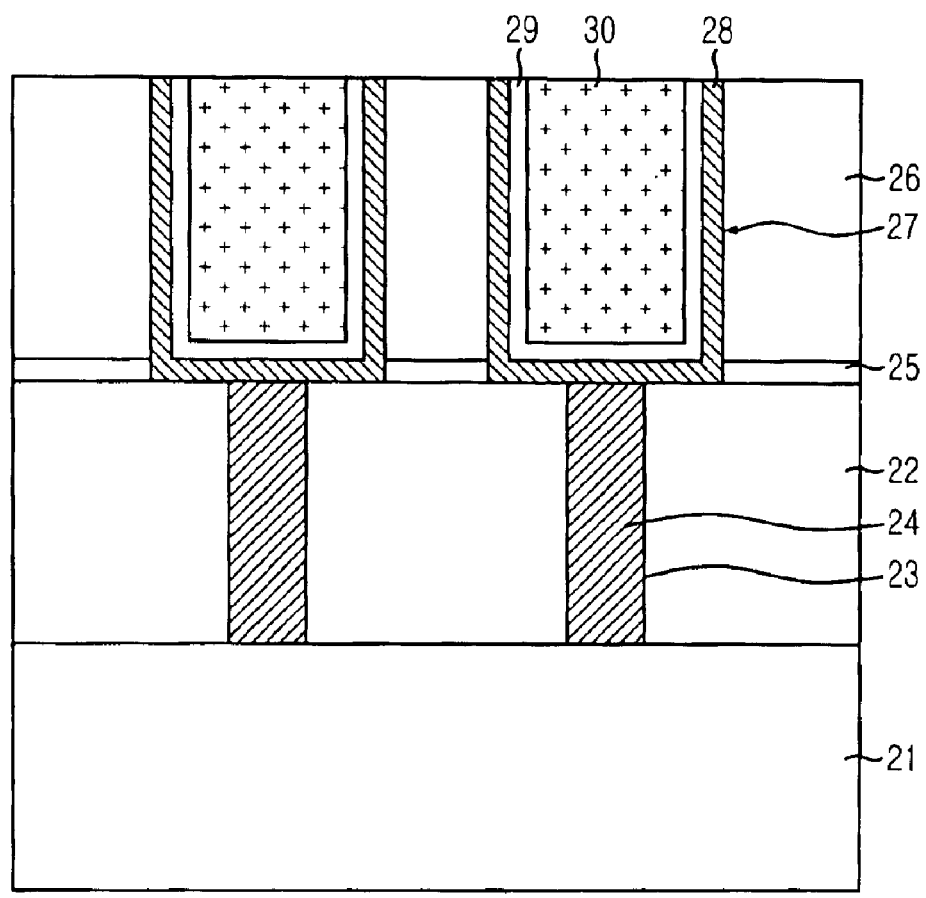
FIGS. 2A to 2D are cross-sectional views illustrating a method for fabricating a capacitor in accordance with a first preferred embodiment of the present invention.

Referring to FIG. 2A, an inter-layer insulation layer 22 is formed on a substrate 21 in which bottom structures including a transistor are formed. Then, contact holes 23 are formed to connect each subsequent lower electrode to a corresponding impurity region of the substrate 21. A conductive material is deposited along a profile containing the holes 23 and is subjected to a chemical mechanical polishing (CMP) process or an etch-back process to planarize the deposited conductive material, so that a plurality of contact plugs 24 are formed. Next, an etch barrier layer 25 and a storage node oxide layer 26 are sequentially deposited on the above resulting structure. At this time, the storage node oxide layer 26 is made of plasma enhanced tetraethylorthosilicate (PETEOS), borophosphosilicate glass (BPSG), phosphosilicate glass (PSG) and undoped silicate glass. Also, the storage node oxide layer 26 has a thickness ranging from about 15000 Å to about 25000 Å.

Afterwards, the storage node oxide layer 26 and the etch barrier layer 25 are etched to form a plurality of holes 27 each exposing the corresponding contact plug 23 disposed beneath each lower electrode region. At this time, the etch barrier layer 25 serves to stop the above etching for forming the holes 27. Particularly, the etch barrier layer 25 is made of a material having a different etch selectivity from the storage node oxide layer 26. Silicon nitride is an example of such material. Also, the etch barrier layer 25 serves to support lateral sides of subsequent storage nodes with high height to thereby provide the lower electrodes with a good mechanical strength.

Figure 2B:
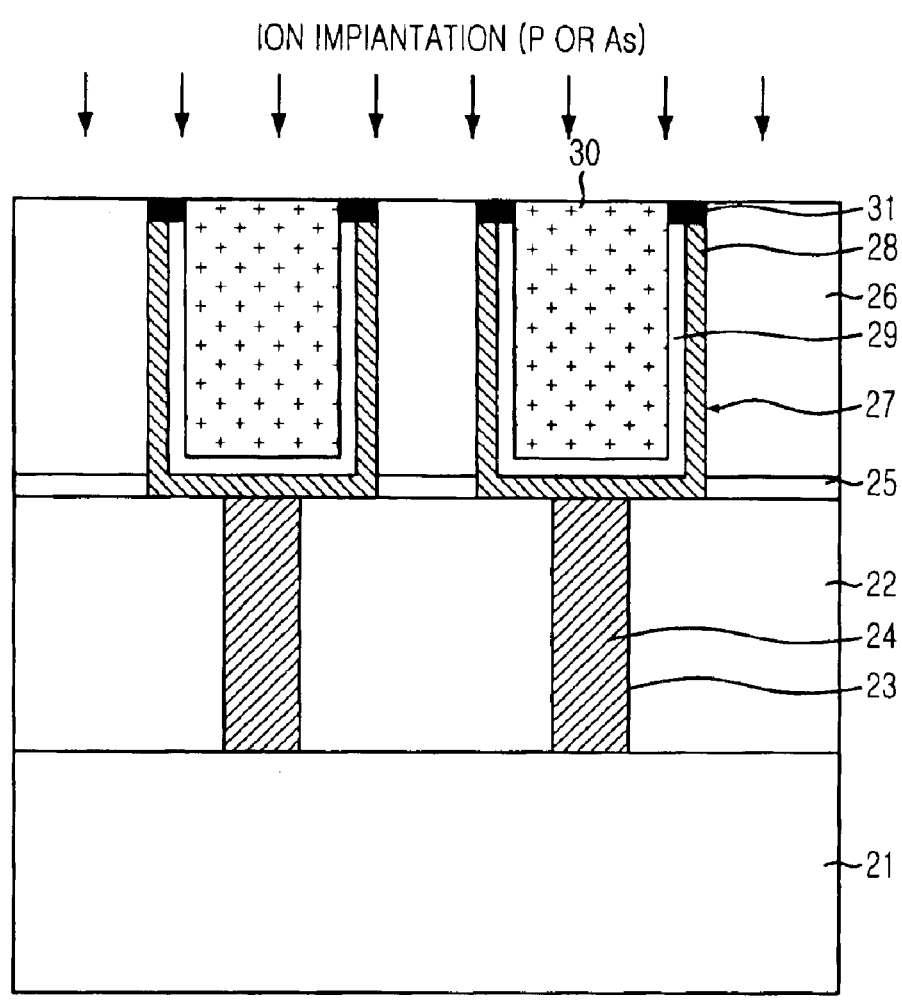

Referring to FIG. 2B, an impurity doped amorphous silicon layer 28 and an impurity undoped amorphous silicon layer 29 are consecutively formed on an entire surface of the above structuring including the holes 27. At this time, the impurity doped amorphous silicon layer 28 and the impurity undoped amorphous silicon layer 29 are formed in an in-situ condition.

Silicon atoms in the impurity doped amorphous silicon layer 28 containing a high concentration of the impurity does hardly move, so that there is no metastable-polysilicon (MPS) grain growth. On the other hand, silicon atoms in the impurity undoped amorphous silicon layer 29 rapidly move, resulting in the MPS grain growth. For this reason, the impurity doped amorphous silicon layer 28 and the impurity undoped amorphous silicon layer 29 are consecutively formed in the in-situ condition. That is, the impurity doped amorphous silicon layer 28 becomes outer walls of a subsequent storage node having a cylinder shape, while the impurity undoped amorphous silicon layer 29 becomes a MPS grain layer formed at inner walls of the cylindrical storage node.

Herein, phosphorus (P) can be used as the impurity doped onto the impurity doped amorphous silicon layer 28. Also, the impurity, i.e., phosphorus (P), can be doped onto the doped amorphous silicon layer 28 as simultaneously as the doped amorphous silicon layer 28 is deposited. At this time, a doping concentration of phosphorus (P) can be controlled by controlling a flow quantity of an impurity source gas containing phosphorus (P) with respect to a silicon source gas. The silicon source gas is a silane-based gas such as monosilane ($SiH_4$), disilane ($Si_2H_6$), trisilane ($Si_3H_8$) and dichlorosilane ($SiH_2Cl_2$), and the impurity source gas containing phosphorus (P) is phosphine ($PH_3$). The doping concentration of the phosphorus doped onto the doped amorphous silicon layer 28 is determined by considering a migration period of the silicon atoms and the size of the MPS grains to be grown. Particularly, with use of secondary ion mass spectrometry (SIMS), the doping concentration of the phosphorus (P) is set to be high ranging from about $1 \times 10^{21}/cm^3$ to about $3 \times 10^{21}/cm^3$.

Meanwhile, the thicknesses of the impurity doped amorphous silicon layer 28 and the impurity undoped amorphous silicon layer 29 are determined by a degree of integration of an intended device and the height and width of the storage node. In this preferred embodiment, the impurity doped amorphous silicon layer 28 is set to have a thickness in a range of about 5% to about 70% of the totally formed amorphous silicon layers 28 and 29.

Also, the impurity doped amorphous silicon layer 28 and the impurity undoped amorphous silicon layer 29 are deposited at a temperature ranging from about 450° C. to about 550° C. At this time, a pressure is maintained in a range from about 0.2 torr to about 3 torr since the silicon layer is crystallized at a temperature above about 550° C. Also, it is not possible to grow MPS grains in the crystallized silicon layer.

After the deposition of the impurity doped amorphous silicon layer 28 and the impurity undoped amorphous silicon layer 29, a chemical mechanical polishing (CMP) process or an etch-back process is performed to remove portions of the impurity doped amorphous silicon layer 28 and the impurity undoped amorphous silicon layer 29 formed on an upper surface of the storage node oxide layer 26. From this CMP process or etch-back process, the impurity doped amorphous silicon layer 28 and the impurity undoped amorphous silicon layer 29 remain in a cylinder shape inside of each hole 27. However, there is a chance that a polishing agent or etch remnants produced during the removal of the portions of the impurity doped amorphous silicon layer 28 and the impurity undoped amorphous silicon layer 29 adhere to inner walls of the cylinder structure. Thus, a photoresist 29 having a good step coverage property is filled into each of the hole 27, and a CMP process or an etch-back process is performed until a surface of the storage node oxide layer 25 is exposed.

Subsequently, an ion-implantation technique is applied to the above resulting structure. For instance, phosphorus or arsenic (As) can be ion-implanted. Herein, the ion-implantation technique is performed to dope the impurity onto head portions of the impurity doped amorphous silicon layer 28 and the impurity undoped amorphous silicon layer 29 both exposed by the above CMP process or etch-back process. As a result of the ion-implantation technique, an ion-implantation layer 31 is formed with a predetermined depth at the head portions of the impurity doped silicon layer 28 and the impurity undoped silicon layer 29.

The above ion-implantation technique will be described in more detail.

In case of ion-implanting phosphorus (P), phosphorus ($^{31}P$) ions are implanted with a concentration ranging from about $1 \times 10^{16}/cm^3$ to about $1 \times 10^{21}/cm^3$ by using ion-implantation energy ranging from about 5 KeV to about 10 keV. Concurrently, the above ion-implantation proceeds by giving a tilt angle ranging from about 0 to about 9 degrees and a twist angle ranging from about −60 degrees to about 60 degrees along with 0 to 4 times of rotation.

In case of ion-implanting arsenic (As), arsenic ($^{75}As$) ions are implanted with a concentration ranging from about $1 \times 10^{16}/cm^3$ to about $1 \times 10^{21}/cm^3$ along with ion-implantation energy ranging from about 5 KeV to about 10 KeV. Concurrently, the ion-implantation proceeds by giving a tilt angle ranging from about 0 to 9 degrees and a twist angle ranging from about −60 degrees to about 60 degrees along with 0 to 4 times of rotation.

The above ion-implantation layer 31 is formed such that it has a projected range (Rp) ranging from about 30 Å to about 125 Å and a peak concentration ranging from about $2.0 \times 10^{21}/cm^3$ to about $4.5 \times 10^{21}/cm^3$.

Figure 2C:
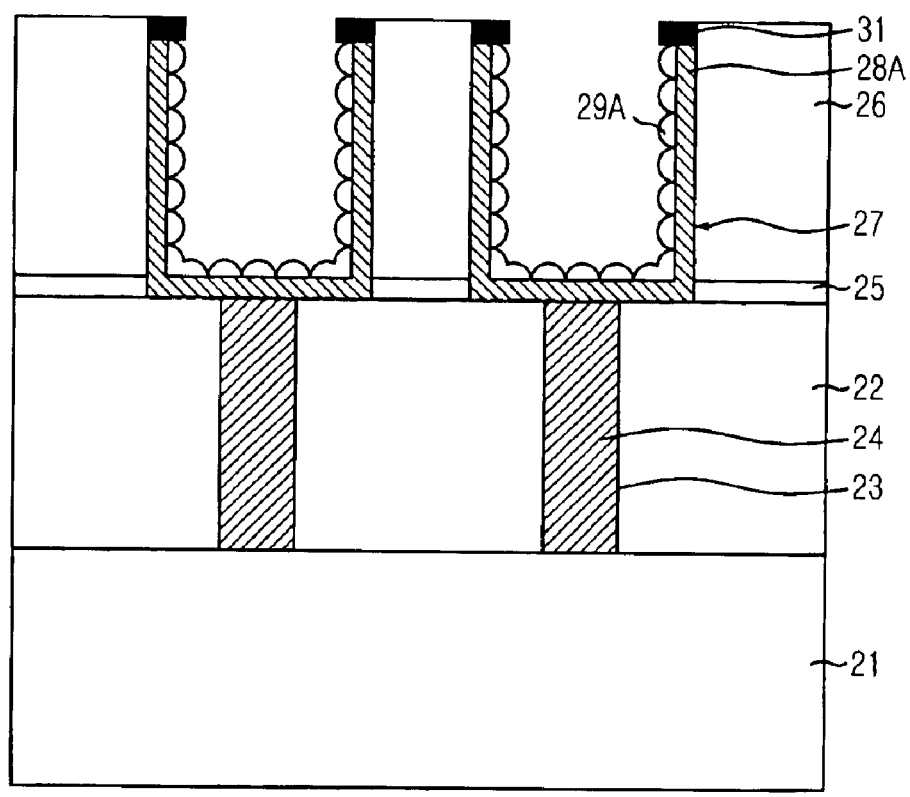

Referring to FIG. 2C, the photoresist 30 is etched away by employing a wet etching process. At this time, the wet etching process uses a mixed solution of sulfuric acid ($H_2SO_4$) and hydrogen peroxide ($H_2O_2$). After the removal of the photoresist 31, a selective MPS process proceeds to form MPS grains 29A on a surface of the impurity doped amorphous silicon layer 28, which is crystallized by the selective MPS process. Hereinafter, the crystallized silicon layer 28 is referred as to the storage node 28A.

More specific to the MPS grain 29A growth, the selective MPS process is performed in a vacuum state maintained with a pressure ranging from about 1 torr to about 4 torr, so that a silicon seed layer is first formed on a surface of the impurity undoped amorphous silicon layer 29 by using a silane-based gas. Thereafter, an annealing process is performed at a temperature ranging from about 600° C. to about 650° C., so that silicon atoms migrate and are grown as the MPS grains 29A. That is, the impurity undoped amorphous silicon layer 29 is grown as the MPS grains 29A, and the impurity doped amorphous silicon layer 28 in which silicon atoms are suppressed from migrating becomes a bone structure of the storage node 28A. Thus, the bone structure of the storage node 28A is maintained with the thickness as much as that of the impurity doped amorphous silicon layer 28.

While the selective MPS process is performed, there is no growth of the MPS grains 29A at head portions of the impurity doped amorphous silicon layer 28 and the impurity undoped amorphous silicon layer 29, i.e., regions where the ion-implantation layer 31 having a peak concentration over about $2.18 \times 10^{21}/cm^3$ is formed. This result is based on the same reason that the MPS grains 29A do not grow on a surface of the impurity doped amorphous silicon layer 28 containing a high concentration of the impurity.

Even if the impurity undoped amorphous silicon layer 29 is formed adjacent to the head portions of the storage node 28A, the ion-implantation layer 31 prevents the MPS grain 29A growth.

Therefore, the MPS grain 29A growth is fundamentally blocked at the head portions of the storage node 28A, and this fact further makes it possible to prevent bridge formation between the storage nodes 28A even if the distance between the neighboring storage nodes 28A becomes narrower.

Figure 2D:
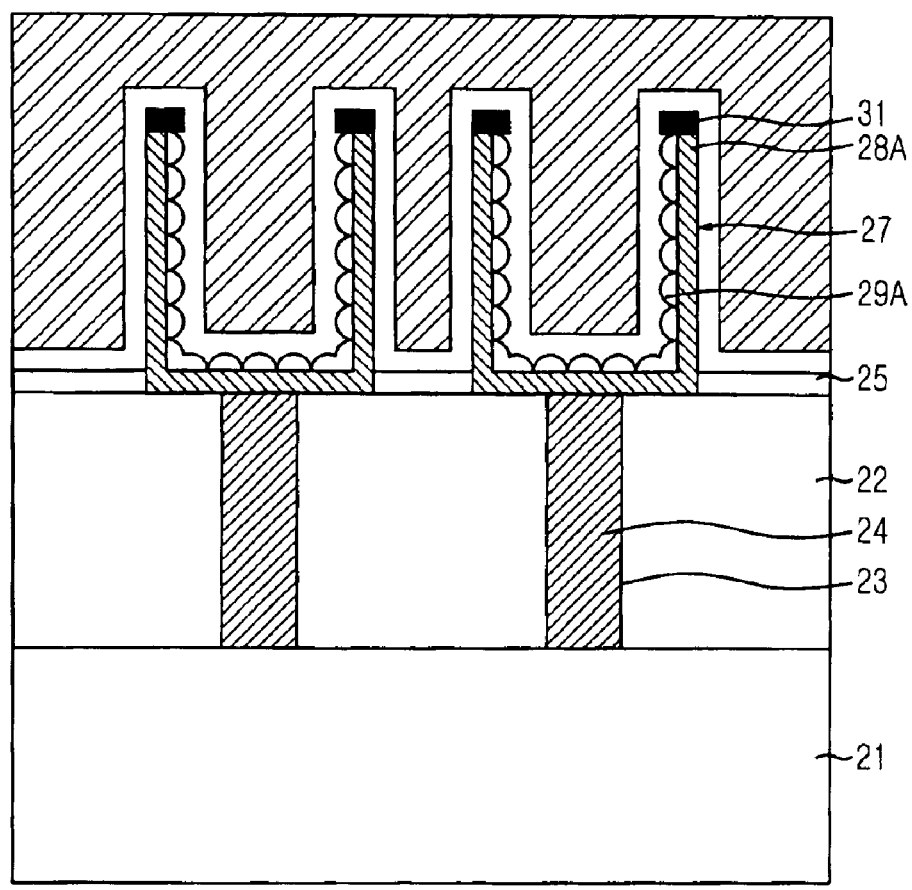

Referring to FIG. 2D, the storage node oxide layer 26 is subjected to one of a dry etching process using a fluorine (F)-based gas and a wet etching process using a wet chemical. At this time, the etch barrier layer 25 is used as an etch stop layer. Then, a dielectric layer 32 and a plate node 33 are deposited on the above resulting structure to thereby complete a capacitor having a cylinder shape.

The above first preferred embodiment exemplifies the capacitor having the cylinder shape, wherein the MPS grains are grown only the inner walls of the storage node having the cylinder shape. However, it is still possible to form a capacitor having a concave shape by forming the dielectric layer and the plate node without removing the storage node oxide layer.

FIGS. 3A to 3D are cross-sectional views illustrating a method for fabricating a capacitor having a concave shape in accordance with a second preferred embodiment of the present invention. The same reference numbers are used for the same constitution elements shown in FIGS. 2A to 2D, and the detailed descriptions on FIGS. 2A to 2C showing steps of forming such constitution elements are omitted.

Figure 3A:
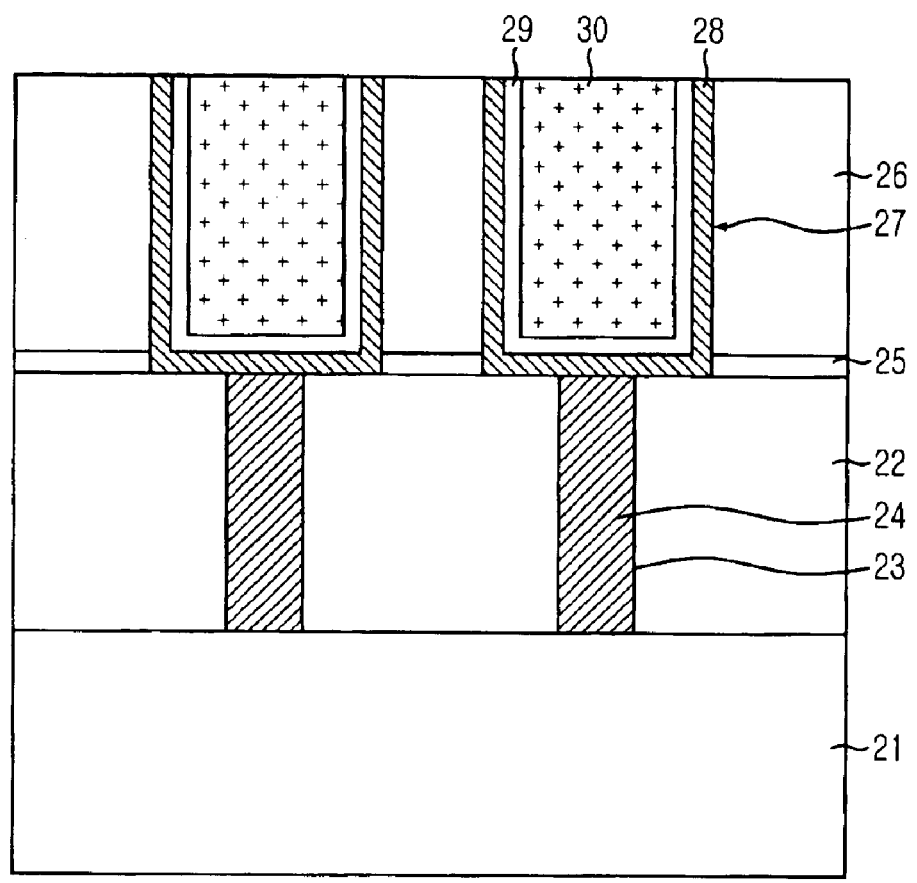
FIGS. 3A to 3D are cross-sectional views illustrating method for fabricating a capacitor in accordance with a second preferred embodiment of the present invention.
Figure 3B:
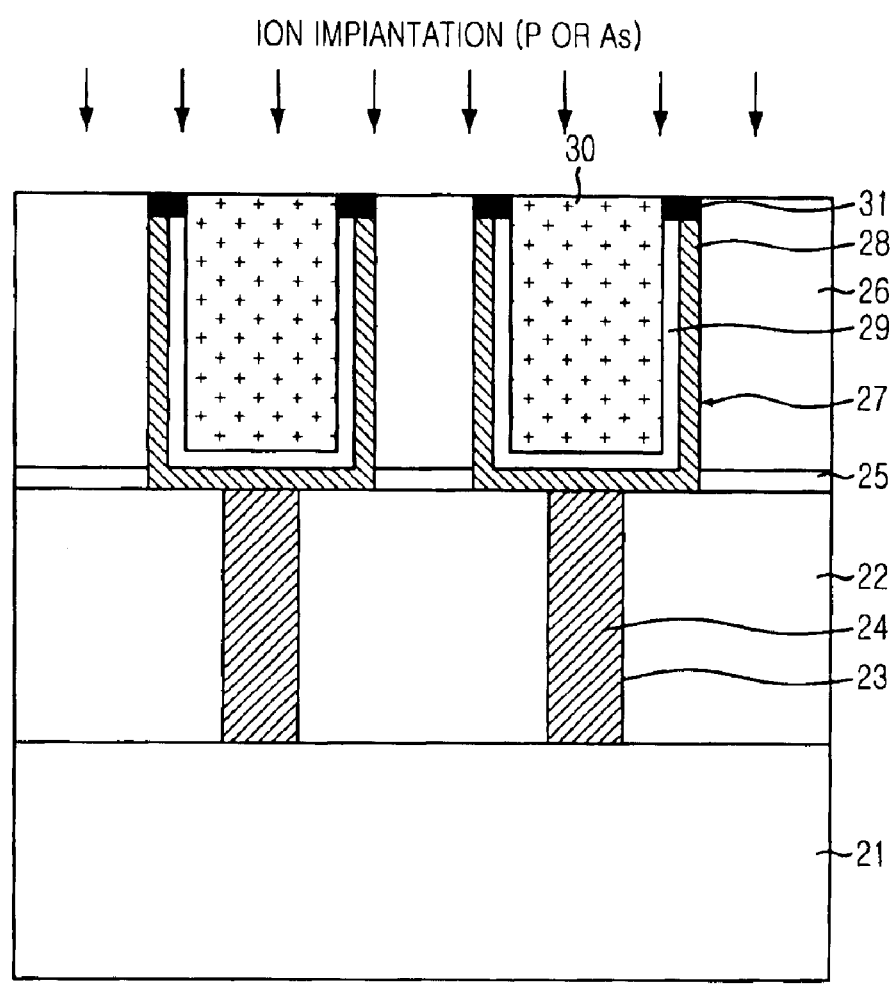
Figure 3C:
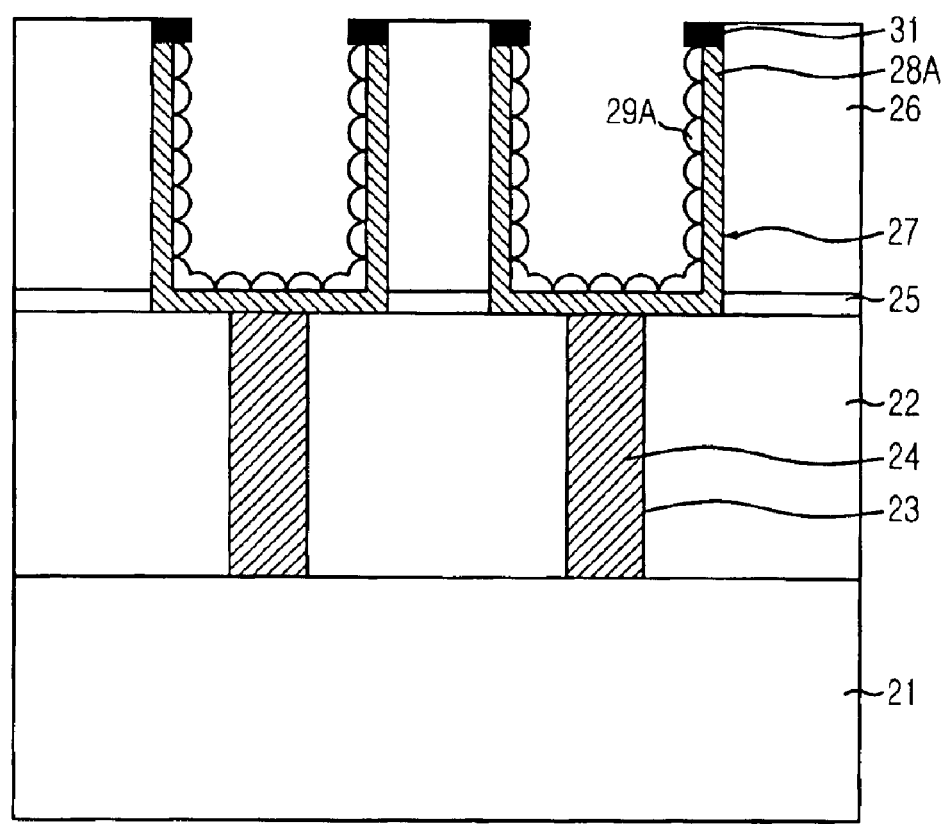
Figure 3D:
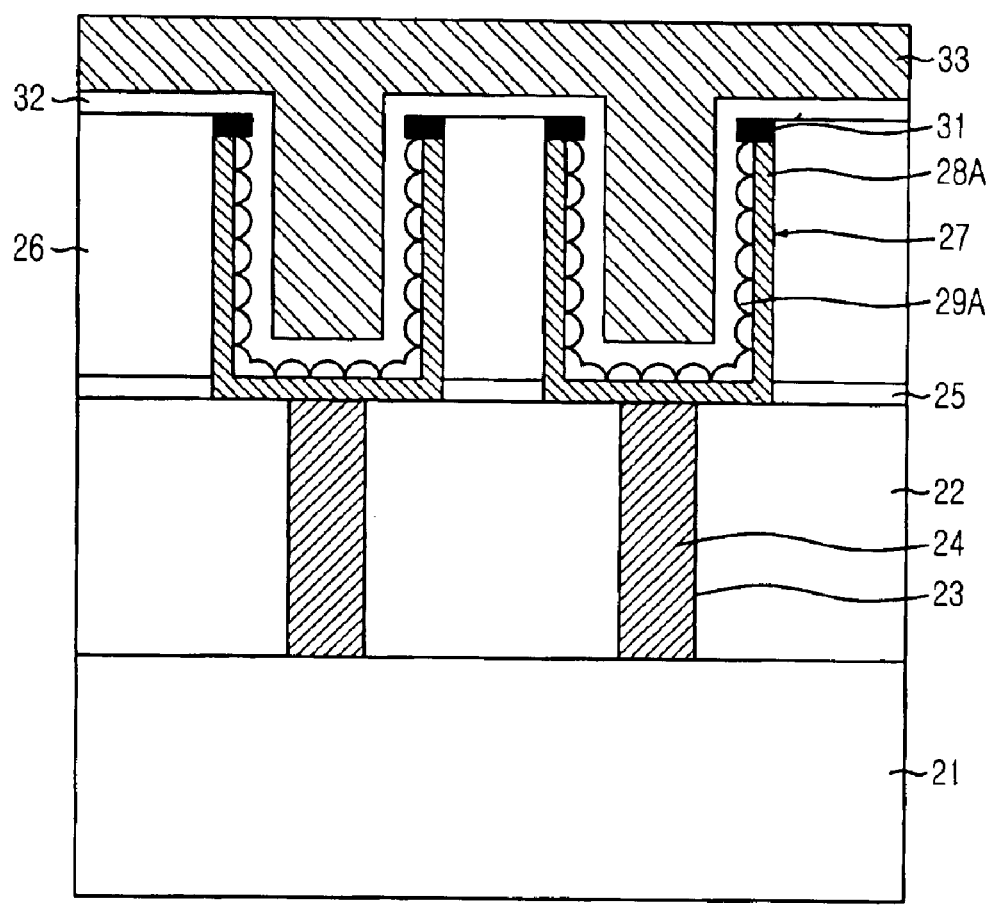

Referring to FIG. 3D, on an entire surface of a structure obtained after the photoresist 30 is removed, a dielectric layer 32 and an upper electrode 33 are formed without performing a wet dip-out process to the storage node oxide layer 26 to thereby complete the formation of capacitor having the concave structure.

The capacitor having the concave shape as shown in FIGS. 3A to 3D also includes the ion-implantation layer 31 formed at the head portions of the storage node 28A by having a peak concentration of about $2.18 \times 10^{21}/cm^3$. Thus, there is no MPS grain 29A growth at the head portions of the storage node 28A during the selective MPS process for growing the MPS grains 29A.

For this reason, it is possible to prevent bridge formation between the storage nodes 28A even if the distance between the neighboring storage nodes 28A becomes narrower. This result is because the MPS grain 29A growth is fundamentally blocked at the head portions of the storage node 28A by the ion-implantation layer 31.

Figure 4:
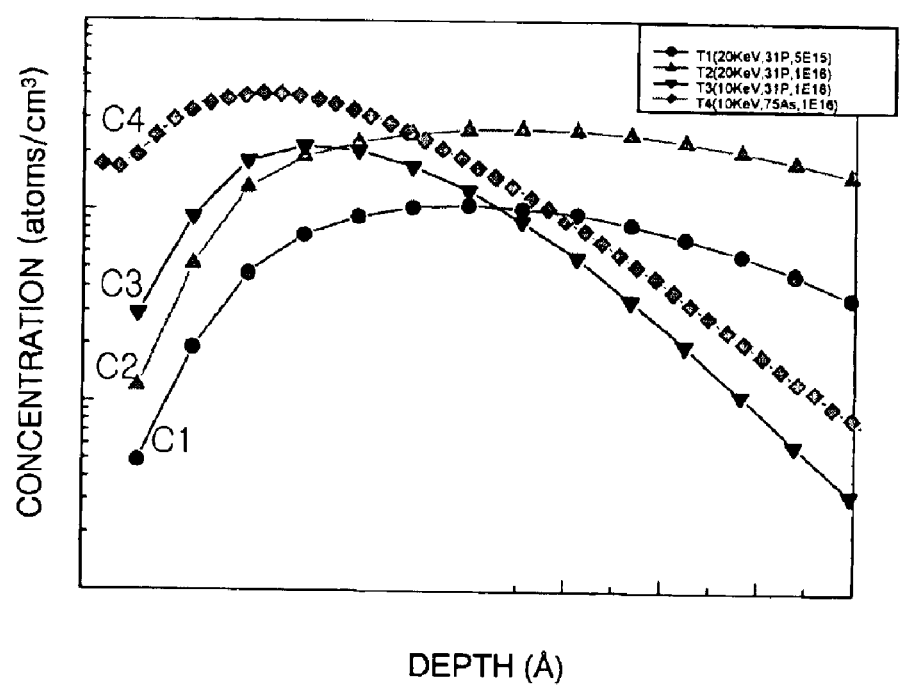
FIG. 4 is a graph showing different doping profiles of head portions of the storage node on the basis of a relationship between a depth of the head portion and an ion-implantation condition.

FIG. 4 is a graph showing different doping profiles of head portions of the storage node on the basis of a relationship between a depth of the head portion and an ion-implantation condition.

Herein, the reference symbol C1 is a sample T1 obtained by ion-implanting phosphorus ($^{31}P$) ions with a concentration of bout $5 \times 10^{15}/cm^3$ along with ion-implantation energy of about 20 KeV. The reference symbol C2 is a sample T2 obtained by ion-implanting ($^{31}P$) ions with a concentration of bout $1 \times 10^{16}/cm^3$ along with ion-implantation energy of about 20 KeV. The reference symbol C3 is a sample T3 obtained by ion-implanting ($^{31}P$) ions with a concentration of bout $1 \times 10^{16}/cm^3$ along with ion-implantation energy of about 10 KeV. The reference symbol C4 is a sample T4 obtained by ion-implanting arsenic ($^{75}As$) ions with a concentration of bout $1 \times 10^{16}/cm^3$ along with ion-implantation energy of about 10 KeV.

As shown, it is observed that the T1 sample and the T2 sample have a peak concentration ranging from about $1.0 \times 10^{21}/cm^3$ to about $2.0 \times 10^{21}/cm^3$ at the depth in a range from about 125 Å to about 150 Å. Also, it is observed that the sample T3 and the sample T4 have a peak concentration ranging from about $2.0 \times 10^{21}/cm^3$ to about $4.5 \times 10^{21}/cm^3$ at the depth in a range from about 30 Å to about 125 Å.

Table 1 provided in the following shows whether or not the MPS grains are grown under the above described different condition applied to each sample.

TABLE 1

| Condition | MPS grain growth | Rp (Å) | Peak concentration (/cm³) |
|---|---|---|---|
| reference sample | Yes | N/A | N/A |
| T1 (20 KeV, $^{31}P$, 5 × 10$^{15}$/cm²) | Yes | 199 | 1.07 × 10$^{21}$ |
| T2 (20 KeV, $^{31}P$, 1 × 10$^{16}$/cm²) | Yes | 227 | 2.68 × 10$^{21}$ |
| T3 (10 KeV, $^{31}P$, 1 × 10$^{16}$/cm²) | No | 114 | 2.18 × 10$^{21}$ |
| T4 (10 KeV, $^{75}As$, 1 × 10$^{16}$/cm²) | No | 92.7 | 4.05 × 10$^{21}$ |

According to Table 1, the MPS grain growth is observed in the reference sample, i.e., an impurity undoped silicon layer without the application of ion-implantation, the sample T1 and the sample T2. However, there is not observed the MPS grain growth in the sample T3 and the sample T4. That is, preferable ion implantation energy and concentration for suppressing the MPS grain growth are about 10 KeV and $1 \times 10^{16}/cm^3$, respectively. At this time, the Rp and the peak concentration allowing the suppression of the MPS grain growth with use of the above mentioned ion-implantation energy are about 114 Å and $2.18 \times 10^{21}/cm^3$, respectively.

Based on the facts described in Table 1, if the ion-implantation energy, which is a factor for determining the depth to which the ion-implantation continues, is greater than about 10 KeV, the depth to which the ion-implantation continues becomes deeper, and the MPS grains are started to be grown at the head portions of the storage node. Thus, a preferable range of the ion-implantation energy is from about 5 KeV to about 10 KeV. Also, if the dose concentration of ion-implantation is less than about $1\times10^{16}/cm^3$, the MPS grains may be grown. Thus, the dose of the ion-implantation preferably sets over $1\times10^{16}/cm^2$.

In addition to the above provided preferred embodiments, it is still possible to form the outer walls and the inner walls of the storage node with the impurity undoped amorphous silicon layer, so that an effective surface area of the storage node increases by growing MPS grains are grown on both the inner walls and outer walls. However, in this case, the MPS grains formed at the outer walls of the storage node may be come off during subsequent processes, further resulting in bridge formation between the storage nodes. Thus, it is preferable to grow the MPS grains only the inner walls of the storage node even though the effective surface area of the storage node decreases.

Also, after the removal of the photoresist and the storage node oxide layer, the ion-implantation layer can be formed at the head portions of the storage node through the ion-implantation technique. However, the ion-implantation technique may be performed to bottom portions of the storage node, and thus, the MPS grains are not grown around these regions. As a result, it is limited to increase the effective surface area of the storage node. Therefore, it is preferable to perform the ion-implantation technique for suppressing the MPS grain growth under a state in which the photoresist remains before the storage node oxide layer is removed.

As seen from the above described preferred embodiments of the present invention, it is possible to prevent the MPS grain growth at the outer walls and the head portions of the storage node to thereby prevent the bridge formation between the storage nodes. Eventually, there is an effect of increasing yields of semiconductor devices.

While the present invention has been described with respect to certain preferred embodiments, it will be apparent to those skilled in the art that various changes and modifications may be made without departing from the scope of the invention as defined in the following claims.

What is claimed is:

1. A method for fabricating a capacitor, comprising the steps of:
   forming a storage node oxide layer having a hole for forming a storage node on a substrate;
   forming a silicon layer on the storage node oxide layer having the hole;
   forming a photoresist on the silicon layer such that the photoresist fills the hole;
   forming a storage node having a cylinder shape inside of the hole by removing the silicon layer disposed on an upper surface of the storage node oxide layer;
   ion-implanting an impurity onto head portions of the storage node under a state that the photoresist remains;
   removing the photoresist; and
   growing metastable-polysilicon (MPS) grains on inner walls of the storage node.

2. The method as recited in claim 1, wherein the step of ion-implanting the impurity proceeds by applying a dose concentration of the impurity set over about $1\times10^{16}/cm^2$ along with ion-implantation energy in a range from about 5 KeV to about 10 KeV.

3. The method as recited in claim 1, wherein the impurity is phosphorus or arsenic ions.

4. The method as recited in claim 2, wherein the impurity is phosphorus or arsenic ions.

5. The method as recited in claim 1, wherein the step of ion-implanting the impurity proceeds by giving a tilt angle ranging from about 0 to about 9 degrees and a twist angle ranging from about −60 degrees to about 60 degrees along with about 0 to 4 times of rotation.

6. The method as recited in claim 2, wherein the step of ion-implanting the impurity proceeds by giving a tilt angle ranging from about 0 to about 9 degrees and a twist angle ranging from about −60 degrees to about 60 degrees along with about 0 to 4 times of rotation.

7. The method as recited in claim 1, wherein the step of ion-implanting the impurity proceeds such that a projected range ranges from about 30 Å to about 125 Å and a peak concentration ranges from about $2.0\times10^{21}/cm^3$ to about $4.5\times10^{21}/cm^3$.

8. The method as recite in claim 2, wherein the step of ion-implanting the impurity proceeds such that a projected range ranges from about 30 Å to about 125 Å and a peak concentration ranges from about $2.0\times10^{21}/cm^3$ to about $4.5\times10^{21}/cm^3$.

9. The method as recited in claim 1, wherein the silicon layer includes an impurity doped amorphous silicon layer, which is a bone structure of the storage node, and an impurity undoped amorphous silicon layer, in which the MPS grains are grown.

* * * * *